United States Patent [19]

Yi

[11] Patent Number: 5,657,534

[45] Date of Patent: Aug. 19, 1997

[54] TOOL FOR SURFACE MOUNTING DEVICE HEAD

[75] Inventor: Yun Hyung Yi, Anyang, Rep. of Korea

[73] Assignee: LG Industrial Systems Co., Ltd., Seoul, Rep. of Korea

[21] Appl. No.: 523,144

[22] Filed: Sep. 5, 1995

[30] Foreign Application Priority Data

Sep. 16, 1994 [KR] Rep. of Korea .................. 23644/1994

[51] Int. Cl.$^6$ ............................ H05K 13/04; H01R 43/00
[52] U.S. Cl. .................................................. 29/743; 29/740
[58] Field of Search ..................... 29/740, 743, 33.1 L, 29/33 R, 834; 409/231

[56] References Cited

U.S. PATENT DOCUMENTS

| | | | |
|---|---|---|---|
| 4,135,630 | 1/1979 | Snyder et al. | 29/740 X |
| 4,611,397 | 9/1986 | Janisiewicz et al. | 29/834 |
| 4,703,965 | 11/1987 | Lee et al. | 29/743 X |
| 4,759,124 | 7/1988 | Snyder et al. | 29/740 X |
| 4,858,974 | 8/1989 | Stannek | 29/33 K X |
| 4,860,438 | 8/1989 | Chen | 29/740 |
| 4,964,208 | 10/1990 | Fujioka | 483/69 |

FOREIGN PATENT DOCUMENTS

| | | |
|---|---|---|
| 0253228 | 1/1988 | European Pat. Off. . |
| 0460553 | 12/1991 | European Pat. Off. . |
| 0500246 | 8/1992 | European Pat. Off. . |

Primary Examiner—William R. Briggs
Attorney, Agent, or Firm—Oliff & Berridge

[57] ABSTRACT

A tool for a surface mounting device head and a tool automatic changing apparatus, and particularly to a tool for a surface mounting device head and a tool automatic changing apparatus capable of stably aligning surface mounting parts, minimizing vibrations of a suction nozzle retaining corresponding parts thereof, and easily changing the tool and a suction nozzle in operation, which includes a tool body fixed to a plurality of fixing shafts in which a change plate, an intermediate plate, and a guiding plate are fixed in order and spaced apart from a head block section, so that the tool body is detachably engaged to the head block section and a tool automatic changing apparatus; a pressurizing member engaged to the intermediate plate and the guiding plate of the tool body, being incorporated with a pneumatic cylinder of the head block section and being movable upwardly/downwardly; a nozzle section engaged to the central portion of the intermediate plate and the guiding plate, being incorporated with the pressurizing member and being movable upwardly/downwardly; a first elastic member engaged between the nozzle section and the intermediate plate for upwardly supporting the pressurizing member; a second elastic member engaged to the outer circumference of the nozzle section for upwardly supporting the nozzle section; a plurality of parts retaining slider engaged for a lineal movement within a guide opening formed at 90° angle at the guiding plate; and an alignment member for enabling the parts retaining slider by the pressurizing member.

11 Claims, 15 Drawing Sheets

TOOL FOR SURFACE MOUNTING DEVICE HEAD

BACKGROUND OF THE INVENTION

1. Field of the Invention

The present invention relates to a tool for a surface mounting device head and a tool automatic changing apparatus thereof, and particularly to a tool for a surface mounting device head and a tool automatic changing apparatus capable of stably aligning parts of a surface mounting device, minimizing vibrations of a suction nozzle retaining corresponding parts thereof, and easily changing the tool and a suction nozzle in operation.

2. Description of the Conventional Art

Recently, electronic parts in the industry become very density and compact size as the electric and electronic products are down-sized. A surface mounting technology has been developed in the industry to meet the demand of the above-mentioned new technology.

Generally, the surface mounting technology is classified into two categories of a surface mounting device and its assembling technology. So, the development of the surface mounting parts is focused on more compact-sized and very-density products. The assembling technology is focussed on the development of its accurate assembling tools necessary for a surface mounting of corresponding parts and its applied technology.

The surface mounting device is capable of surface-mounting the surface mounting parts on a printed circuit board as a major surface mounting assembling device and can be classified into three types of Tape, Stick, and Tray. In addition, the surface mounting device is directed to mounting corresponding surface mounting parts by receiving from a part feeder and positioning them on where the corresponding parts are surface-mounted.

The surface mounting device is generally divided into a high speed type and a standard type, of which the high speed type is used for assembling the corresponding parts in short time, and the standard type is used for assembling various kinds of corresponding parts.

Therefore, the high speed type is good for a mass production but is bad for an accurate surface mounting, so that it is not good for a small amount of products because of its high price. The standard type is not good for the mass production compared with the high speed type, but is good for manufacturing various kinds of surface mounting parts, so that it is good for manufacturing a various kinds of products and a small amount of production. Therefore, the high speed type is good for the mass production, and the standard type is good for accurate parts.

A surface mounting device head capable of automatically mounting corresponding parts on a conventional hybrid circuit is disclosed in U.S. Pat. No. 4,135,630.

As well disclosed therein, the head of a surface mounting device includes a spindle disposed in the central portion thereof and encased by a housing. In addition, two linear grooves parallel to X-axis and Y-axis are formed in the upper portion of the spindle housing.

A central cam is slidably supported by the spindle housing, and is connected to a corresponding part which is linearly moved and a drive rod. In addition, a finger includes a knife edge and a cam surface, in which the knife edge is pivoted in the linear groove of the spindle housing. A spring clamp is directed to evenly retaining the knife edge.

As described above, in the conventional surface mounting device, the central cam downwardly moves when a drive rod downwardly moves when an external linear actuator is activated. In addition, when the central can is downwardly moved, it comes into contact with a cam surface of the finger. Thereafter, the finger is widened about the knife edge.

However, the conventional surface mounting device has disadvantages in that the size of corresponding parts are limited by a rotation angle of the finger because it uses a part alignment type using a pivot, so that the surface mounting alignment becomes unstable, and thus it is hard to prevent the damages of the corresponding parts.

In addition, retaining the corresponding parts by a suction nozzle is unstable because there is no additional construction for preventing vibration of the suction nozzle retaining the corresponding parts. Moreover, it is impossible to change parts such as a tool and a suction nozzle in operation.

SUMMARY OF THE INVENTION

Accordingly, it is an object of the present invention to provide a tool for a surface mounting device head and a tool automatic changing apparatus, which overcome the problems encountered in a tool for a conventional surface mounting device head and a tool automatic changing apparatus.

It is another object of the present invention to provide a tool for a surface mounting device head and a tool automatic changing apparatus, and particularly to a tool for a surface mounting device head and a tool automatic changing apparatus capable of stably aligning surface mounting parts, minimizing vibrations of a suction nozzle retaining corresponding parts thereof, and easily changing the tool and a suction nozzle in operation. To achieve the above objects, there is provided a tool for a surface mounting device head, which includes a tool body fixed to a plurality of fixing shafts in which a change plate, an intermediate plate, and a guiding plate are fixed in order and spaced apart from a head block section, so that the tool body is detachably engaged to the head block section and a tool automatic changing apparatus; a pressurizing member engaged to the intermediate plate and the guiding plate of the tool body, being incorporated with a pneumatic cylinder of the head block section and being movable upwardly/downwardly; a nozzle section engaged to the central portion of the intermediate plate and the guiding plate, being incorporated with the pressurizing member and being movable upwardly/downwardly; a first elastic member engaged between the nozzle section and the intermediate plate for upwardly supporting the pressurizing member; a second elastic member engaged to the outer circumference of the nozzle section for upwardly supporting the nozzle section; a plurality of parts retaining slider engaged for a lineal movement within a guide opening formed at 90° angle at the guiding plate; and an alignment member for enabling the parts retaining slider by the pressurizing member.

To achieve the above objects, there is provided a tool automatic changing apparatus, which includes a plurality of upper and lower operating cylinders connected to a front and rear support plate; a receiver moved by the front and rear operating cylinder for supporting a change plate of a tool about a plurality of receivers of the front and rear support plate; and a tool fixing member for stably fixing the tool to the receiver.

DETAILED DESCRIPTION OF THE INVENTION

Figure 1:
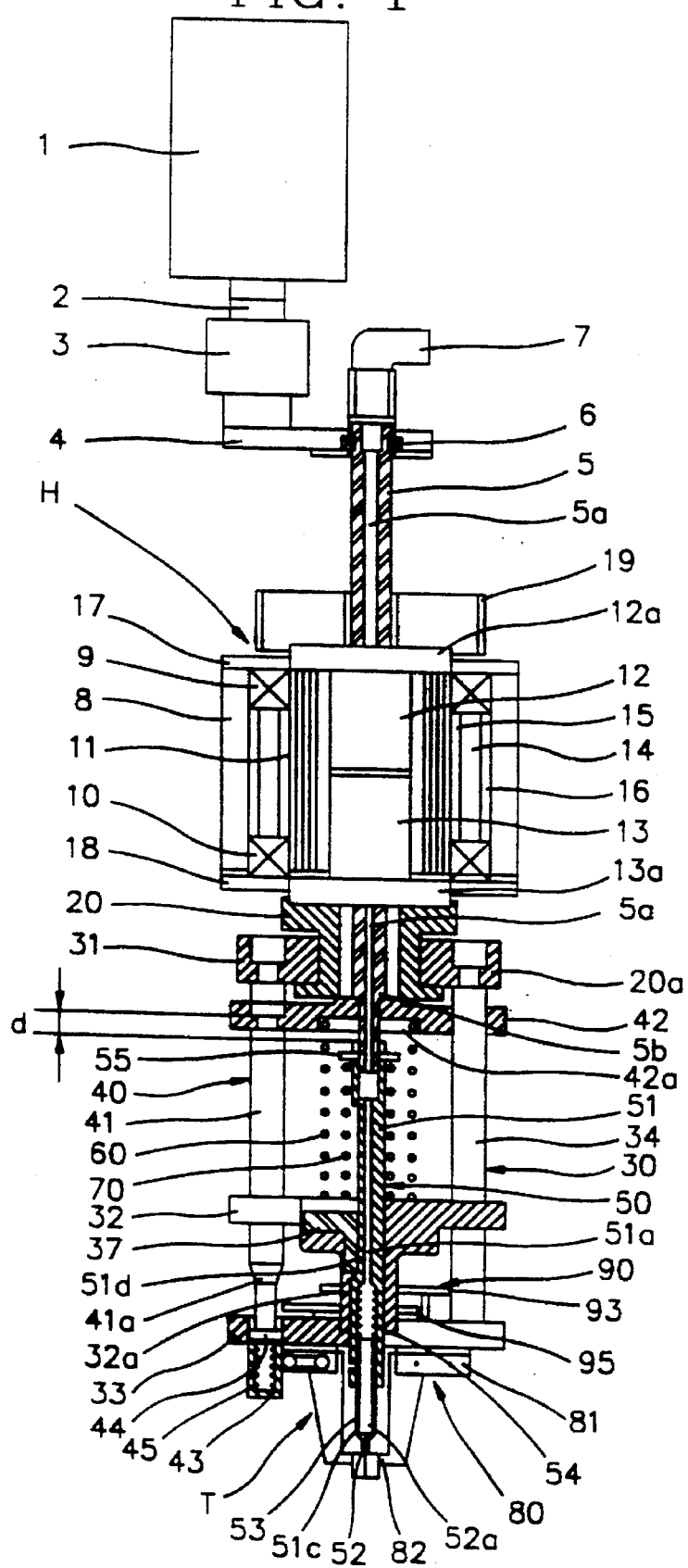
FIG. 1 is a cross-sectional view showing a conventional surface mounting device head when a pneumatic cylinder is in operation.

The construction of a tool for a surface mounting device head and a tool automatic changing apparatus thereof according to the present invention will now be explained with reference to FIGS. 1 and 2.

To begin with, the surface mounting device head is divided into two parts of a head block section H and a tool section T.

The head block section H includes a pneumatic cylinder 1 disposed in a predetermined portion of an X-Y table (not shown). A rod 2 of the pneumatic cylinder 1 is connected to a ball joint 3, and a cylinder connection plate 4 is supported by a cylinder connection plate 4.

A ball spline shaft 5 is engaged into the cylinder connection plate 4 in a state that a ball bearing 6 is engaged to the one side thereof. A rotary pneumatic connection port 7 is engaged to the upper portion of the ball spline shaft 5. A pneumatic tube (not shown) of a vacuum generator is connected to the rotary pneumatic connection port 7. The ball spline shaft 5 has a hollow section 5a for controlling the vacuum pressure generated by the vacuum generator.

Meanwhile, angular ball bearings 9 and 10 are disposed at the upper and lower portion of the inner wall of the rectangular block 8 disposed below the pulley 19 spaced apart from the ball spline shaft 5. In addition, an intermediate member 11 is disposed at the inner side of the angular ball bearings 9 and 10. The intermediate member 11 includes flange sections 12a and 13a each formed at a predetermined portion of the upper and lower portions thereof. Ball spline nuts 12 and 13 are engaged with the flange sections 12a and 13a at the inner side of the intermediate member 11. The intermediate 11 and the flange section 12a and 13a of the nuts 12 and 13 are integrally engaged to one another.

The ball spline shaft 5 can be movable up and down against the ball spline nuts 12 and 13, and the ball spline shaft 5 and the ball spline nuts 12 and 13 are rotatable about the rectangular block 8.

The outer peripheral portion of the flange sections 12a and 13a comes into contact with the outer portions of the angular ball bearings 9 and 10, so a predetermined pressure are applied thereto.

As shown in FIG. 1, spaced-apart circular spacers 15 and 16 are engaged between the rectangular block 8 and the intermediate member 11. The upper and lower portions of the spacers 15 and 16 come into contact with the inner portion and outer portion of the angular ball bearings 9 and 10, respectively.

The covers 17 and 18 are engaged to the upper and lower portions of the rectangular block 8, respectively.

Figure 2:
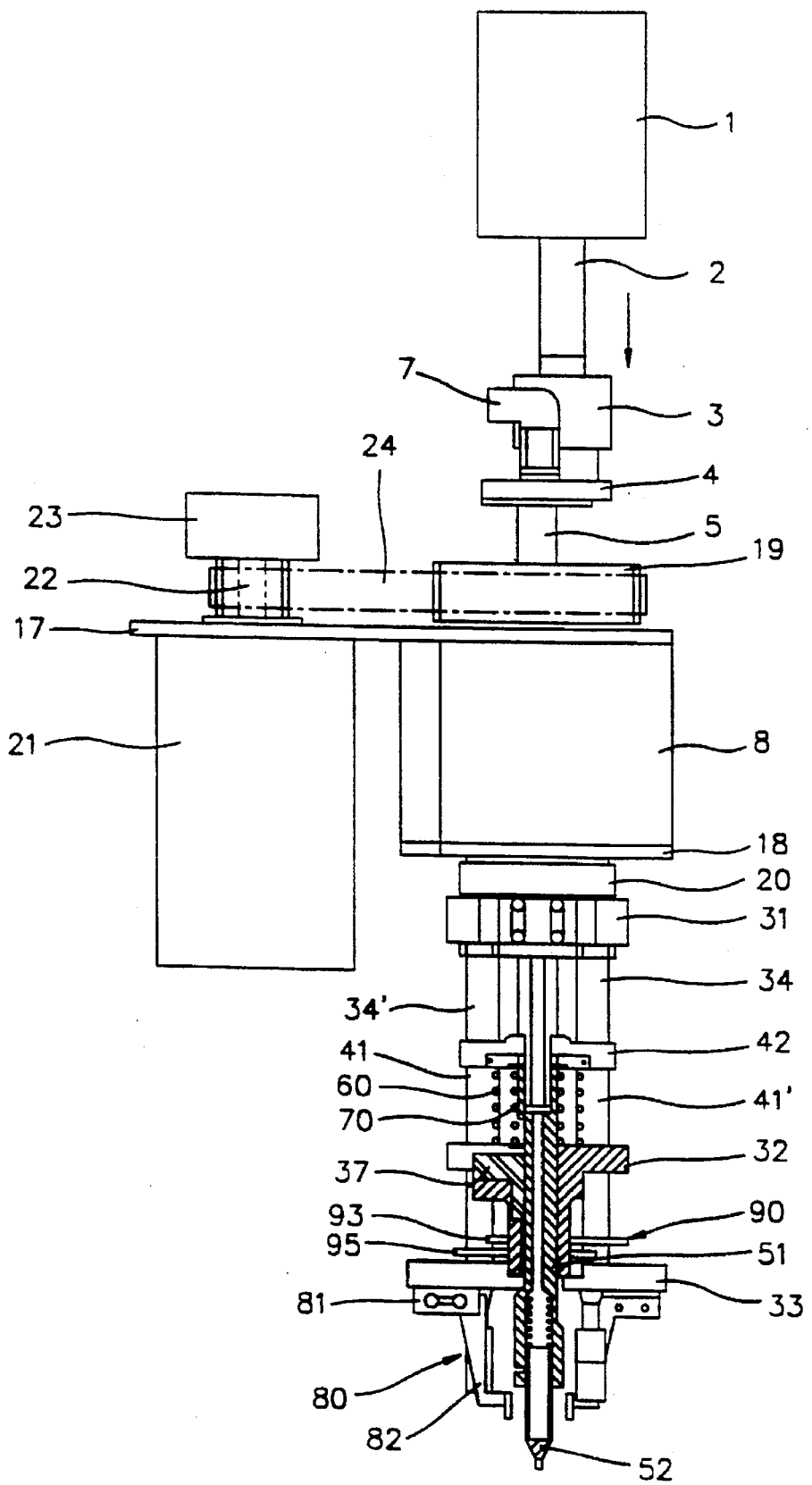
FIG. 2 is a cross-sectional view showing a conventional surface mounting device head when a ball spline shaft is lowered by a pneumatic cylinder for an upper and lower operation thereof.

In addition, the cover 17, as shown in FIG. 2, is larger than the cover 18. A timing pulley 19 is fixed to the flange section 12a of the ball spline nut 12. A change base 20 is fixed to the flange section 13a of the lower ball spline nut 13.

The timing pulley 19, as shown in FIG. 2, is engaged to the upper portion of the upper cover 17 so that it is rotatable together with the ball spline shaft 5 passed through the timing pulley 19. In addition, a driving motor 21 is disposed at the one side of the upper cover 17. A driving timing pulley 23 is rigidly engaged to the rotary shaft 22 of the driving motor 21. In addition, the driving timing pulley 23 and the timing pulley 19 are drivingly connected to each other.

Figure 3A:
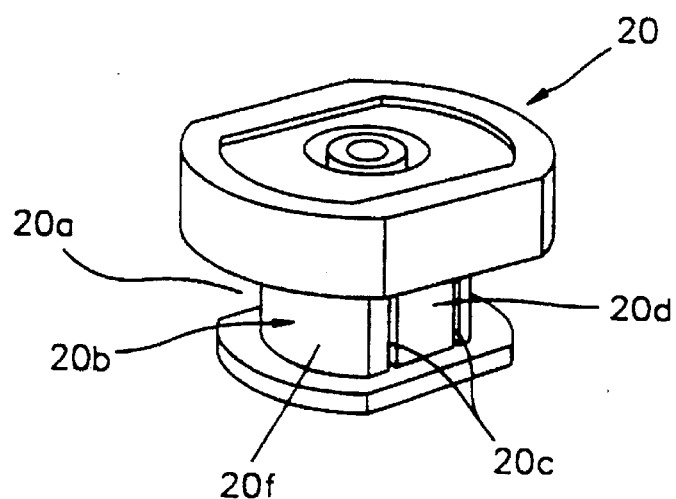
FIG. 3A is a perspective view showing an changing base of a tool of a surface mounting device head according to the present invention.
Figure 3B:
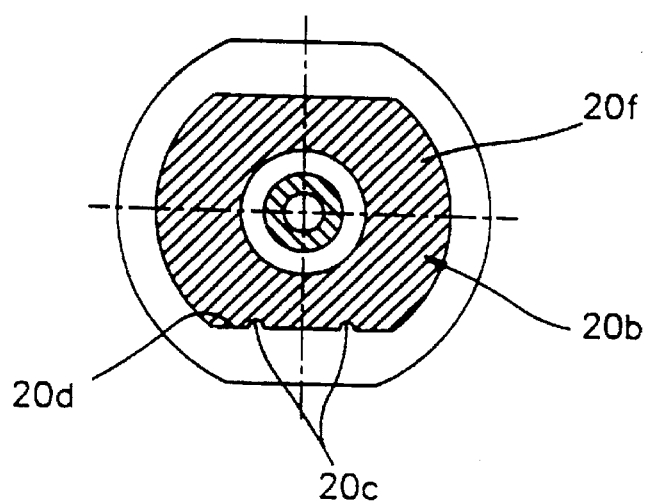
FIG. 3B is a horizontal-sectional view showing a changing base of a tool for a surface mounting device according to the present invention.

The change base 20, as shown in FIGS. 3A and 3B, includes an engaging groove 20a formed at the intermediate portion thereof. The shaft section 20b passing through the intermediate portion thereof is column-shaped and includes a flat section 20d and a circular section 20f. In addition, a spaced-apart engaging groove 20c is formed at the both sides of the flat portion.

Figure 4:
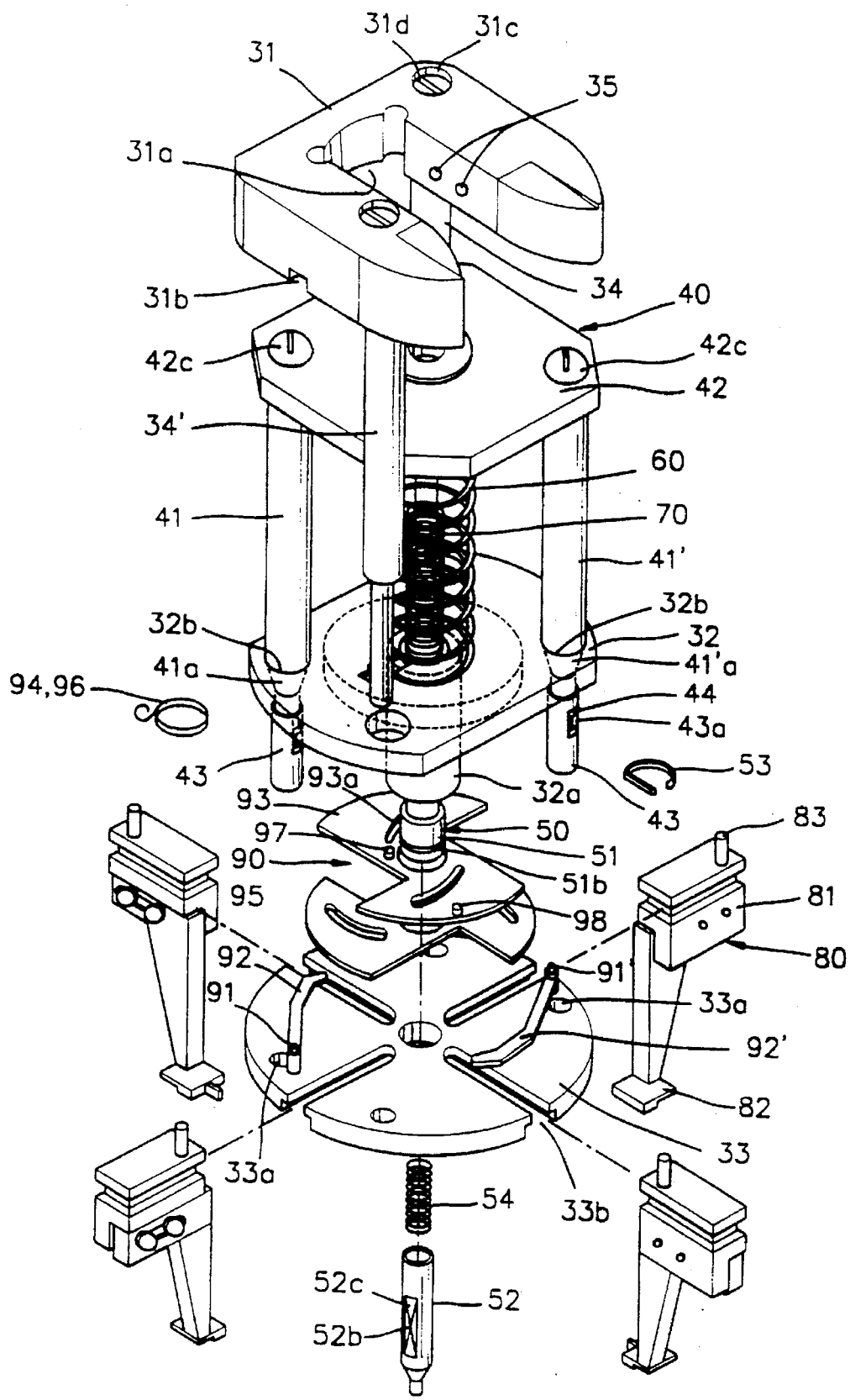
FIG. 4 is a perspective view showing a tool for a surface mounting device according to the present invention.

Meanwhile, a tool T, as shown in FIGS. 1, 2, and 4, includes a change plate 31 spaced apart from the change base 20, an intermediate plate 32, a tool body 30 detachably engaged to the head block section H and a tool automatic changing apparatus, a pressurizing member 40 incorporating with the pneumatic cylinder 1 of the head block section H so that it can move up and down along the intermediate plate 32 and the guiding plate 33 of the tool body 30, a nozzle section 50 incorporating with the up/down operation of the pressurizing member 40 and engaged with the central portion of the intermediate plate 32 and the guiding plate 33 of the tool body 30, an elastic member 60 disposed between the pressurizing member 40 and the intermediate plate 32 for elastically supporting the pressurizing member 40 upwardly, a parts-retaining slider 80 engaged to the guiding plate 33 to have a distance at 90° angle, and an alignment member 90 for driving the slider 80 by means of the up/down movement of the pressurizing member 40.

The construction of the tool T will now be explained in more detail.

The change plate 31 of the tool body 30 includes a engaging groove 31a formed in the one side opposed to the opening section, corresponding to the front portion of the change plate 31 in FIG. 4, to be engaged with the change base 20 of the head block section H. In addition, A shaft section 20b of the engaging groove 31a as shown in FIG. 3A is engaged to the flat section 20d of the change base 20, and the circular section 20f of the change base 20 is engaged to the opening section.

Figure 6:
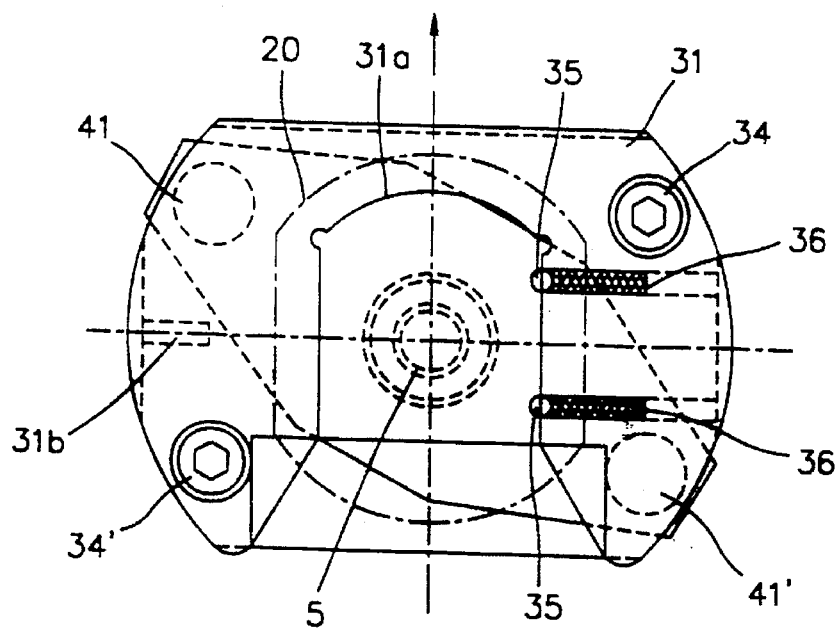
FIG. 6 is a plan view showing an exchange plate engaged to the change base of a head block for a surface mounting device according to the present invention.

An engaging ball 35 engaged to the engaging groove 20c of the change base 20 is outwardly projected at the both side wall of the engaging groove 31a. In addition, the engaging ball 35, as shown in FIG. 6, is supported outwardly by the pressurizing spring 36.

The lower portion of the engaging groove 31b is opened. The engaging groove 31b is engaged to the tool automatic changing apparatus.

The intermediate plate 32 includes a cylindrical section 32a so that there can be provided more contact surface with the nozzle section 50 thus retaining the nozzle section 50 more accurately.

The pressurizing member 40 includes pushing shafts 41 and 41' engaged with guiding openings 32b and 33a formed inside the both sides of the intermediate plate 32 and the guiding plate 33, and a pushing shaft 42 coming into contact with a recess 5b formed at the lower portion of the ball spline shaft 5 and fixed to the upper portio of the pushing shafts 41 and 41'.

The fixing shafts 34 and 34' are fixed to the opening 31c by means of screws 31d and 31d', the pushing shafts 41 and 41' are fixed to a pair of openings (not shown) formed on the outer circumferential surface of the pushing plate 42 by the screw 42c. In addition, the pushing shafts 41 and 41' and the fixing shafts 34 and 34' are opposed respectively.

The pushing shafts 41 and 41' include tapered sections 41a and 41a' for enabling the alignment member 90, and the lower portions of the tapered sections 41a and 41a' are connected to a support shaft section 43 having an elongated opening 43a formed at the lower portion thereof by a pin 44.

Meanwhile, a pressuring spring 45 is inserted into the support shaft section 43. In addition, the support shaft section 43 is directed to electrically supporting a predetermined portion of the parts supplier (not shown).

The elastic member 60 elastically supporting the pressuring member 40 upwardly is inserted into the nozzle section 50 between the intermediate plate 32 and the guiding plate 33, i which the upper portion thereof comes into contact with the upper portion of the recess 42a formed at the intermediate portion of the lower surface of the pressurizing plate 42 and the lower portion thereof comes into contact with the upper surface of the intermediate plate 32.

The nozzle section 50, as shown in FIG. 4 and FIGS. 5A through 5C, includes a nozzle shaft 51 engaged to the intermediate plate 32 and the guiding plate 33, a suction nozzle 52 detachably engaged to the lower portion of the nozzle shaft 51, a fixing spring 53 to prevent the deviation of the suction nozzle 52 and engaged to the lower portion of the nozzle shaft 51, and a pressurizing spring 54 for elastically supporting the suction nozzle 52 and inserted into the inside of the nozzle shaft 51.

Meanwhile, the nozzle shaft 51 and the suction nozzle 52, as shown in FIG. 1, includes hollow sections 51a and 52b connected with the opening section 5a of the ball spline shaft 5.

Figure 5A:
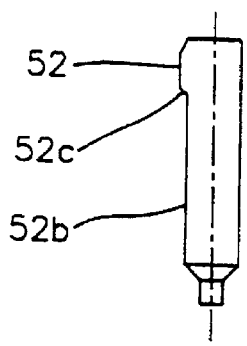
FIG. 5A is a front view showing a suction nozzle of a tool for a surface mounting device according to the present invention.
Figure 5B:
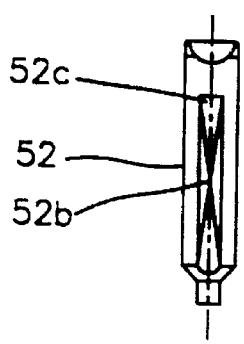
FIG. 5B is a side view showing a suction nozzle of a tool for a surface mounting device according to the present invention.

The suction nozzle, as shown in FIG. 5A and 5B, includes a flat section 52b. In addition, as shown in FIG. 4, a spring engaging groove 51 is formed at the outer peripheral of the lower portion of the nozzle shaft 51 and an opening 51c connected to the inside portion of the engaging groove 51b.

A rotary prevention blade 37 is fixed to the intermediate plate 32, and the inner flat surface of the rotary prevention blade 37 comes into contact with the flat surface 51d of the nozzle shaft 51 passing through the intermediate plate 32, thus limiting the rotation of the nozzle shaft 51 against the intermediate plate 32.

Figure 5C:
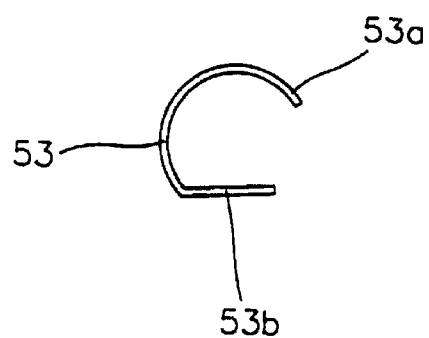
FIG. 5C is a plan view showing a fixing spring of a tool for a surface mounting device according to the present invention.

The fixing spring 53, as shown in FIG. 5C, includes a circular section 53a engaged with the spring engaging groove 51b of the nozzle shaft 51, a lineal section 53b passing through the opening 51c, so that an engaging jaw 52c formed at the flat section 52b of the suction nozzle 52 is engaged to the lineal section 53b thus preventing the separation thereof.

Meanwhile, in case of separating the suction nozzle 52, the suction nozzle 52 is pulled from the nozzle shaft in a state that the suction nozzle 52 is slightly deviated from the engaging jaw 52c of the suction nozzle 52 by rotating the suction nozzle 52.

The upper portion of the nozzle shaft 52 includes a predetermined gap between the nozzle shaft 52 and the recess 42a of the pushing plate 42.

The elastic member 70 elastically supporting the nozzle section upwardly is inserted between the intermediate plate 32 and a stop washer 55 fixed to the upper portion of the nozzle shaft 52. The upper portion of the elastic member 70 comes into contact with the stop washer 55 and the lower portion thereof is supported by the upper surface of the intermediate plate 32.

Figure 7:
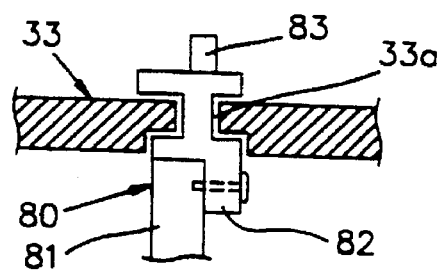
FIG. 7 is a front view showing a part retaining slider of a tool for a surface mounting device according to the present invention.

The parts retaining slider 80, as shown in FIGS. 4 and 7, includes four aligning chucks 81 linearly moving and engaged to the guiding opening 33b formed at the guiding plate 33 at 90° angle, and four jaws 82 fixed to the alignment chuck 81.

Figure 9A:
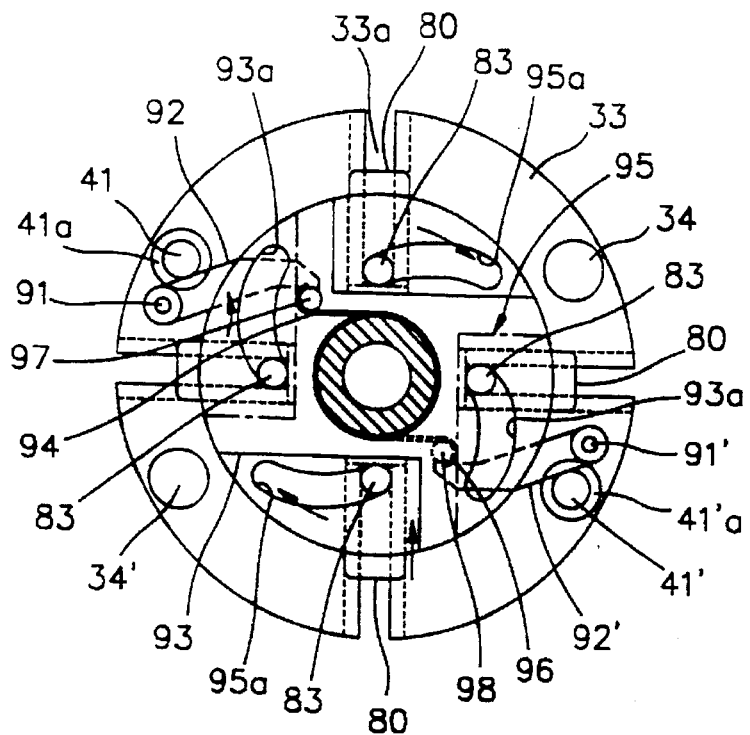
FIG. 9A is a plan view showing a jaw when it is closed according to the present invention.
Figure 9B:
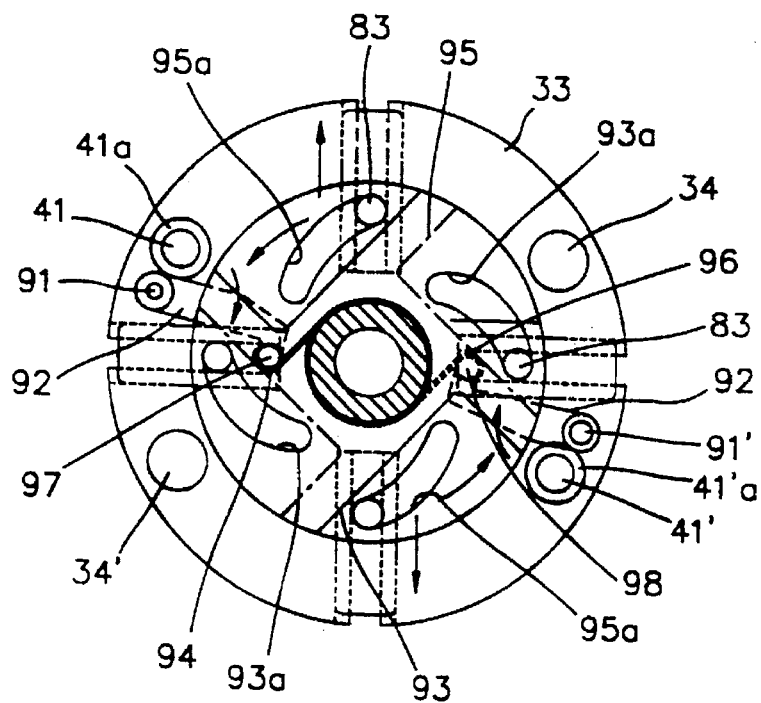
FIG. 9B is a plan view showing a jaw when it is opened according to the present invention.

In addition, the alignment member 90, as shown in FIG. 4 and FIGS. 9A and 9B, operating levers 92 and 92' drivingly coming into contact with the tapered sections 41a and 41a' of the pushing shafts 41 and 41' and rotatable by the shaft pin 33 and formed on the both sides of the upper surface of the guiding plate 33, an upper alignment plate 93 rotatably engaged with the upper portion of the cylindrical section 32a of the intermediate plate 32 and connected to two sliders 80 for enabling the sliders 80 by means of the alignment plate 93, an elastic member 94 elastically supporting the upper alignment plate 93, a lower alignment plate 95 connected to the remaining two sliders 80 for enabling the sliders 80 by means of the operating level 92 of the other side thereof, and an elastic member 96 for elastically supporting the upper alignment plate 93.

Figure 8:
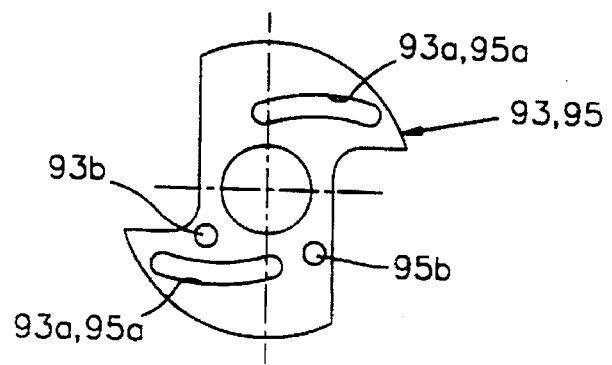
FIG. 8 is a plan view showing an upper and lower aligning plate of a tool for a surface mounting device according to the present invention.

The upper alignment plate 93 and the lower alignment plate 95, as shown in FIG. 8, include a pair of cam openings 93a and 95a, and a pair of pin fixing openings 93b and 95b spaced apart from each other. That is, the upper alignment 93 and the lower alignment plate 95 have the same shape and as shown in FIG. 4, they have 90° angle difference. The engaging pins 97 and 98 contacting with the operating levers 92 and 92' pass through the pin fixing openings 93b and 95b.

In addition, the cam pin 83 fixed to the upper surface of the parts retaining slider 80 is inserted to the cam openings 93a and 95a.

One end of the elastic members 94 and 96, which are torsion springs, are connected to the cylindrical section 32a of the intermediate plate 32, and the other end thereof is connected to the engaging pin 97, so that the upper alignment plate 93 and the lower alignment plate 95 has the rotation force from the same direction.

The construction of the automatic changing apparatus will now be explained.

Figure 16:
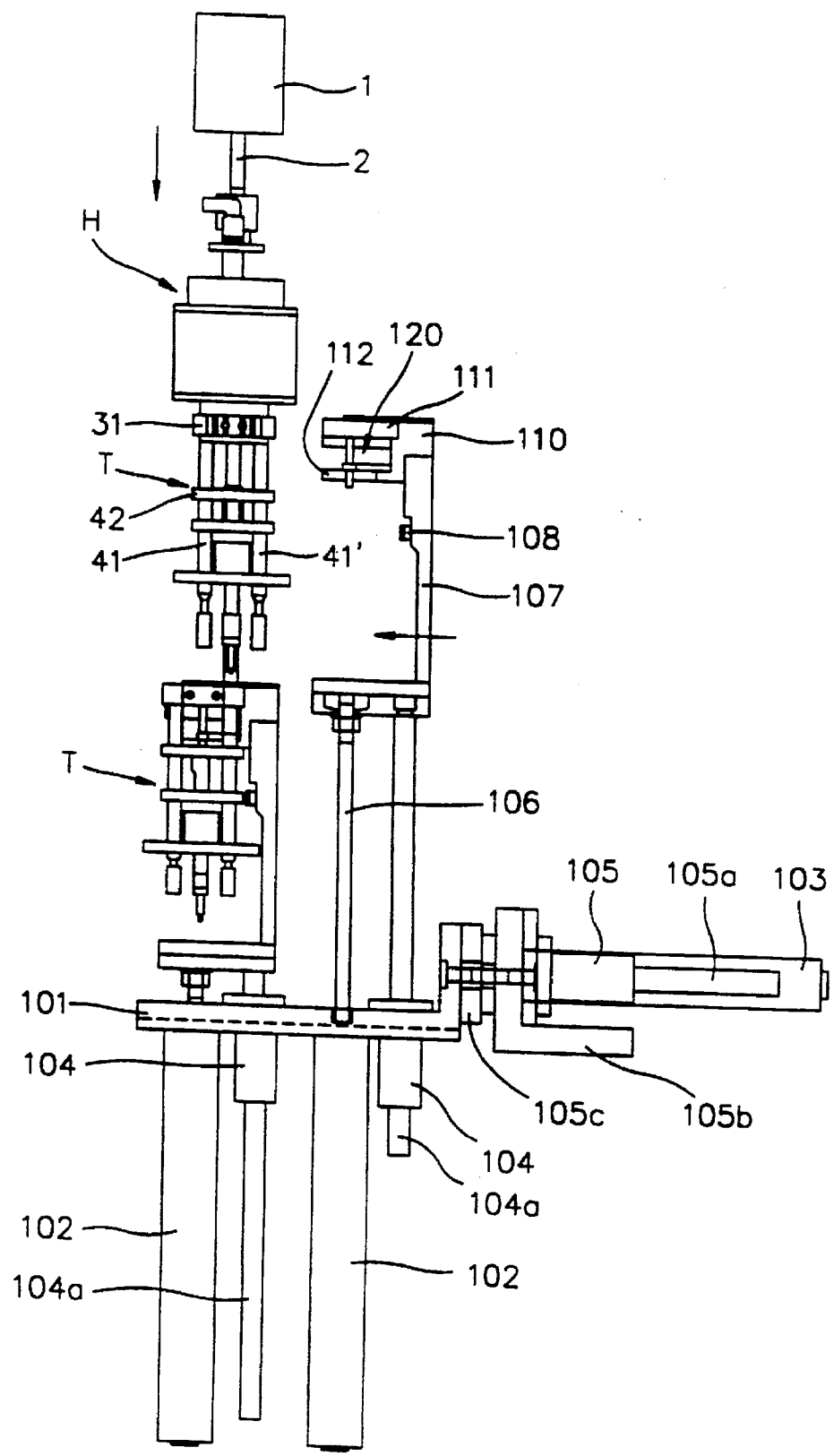
FIG. 16 is a side view showing a tool of a tool automatic changing apparatus for a surface mounting device for explaining a separation of the tool according to the present invention.

Referring to FIGS. 12 and 16, the tool automatic changing apparatus has bi-directional mechanism. That is, the front and rear supporting plate 101 includes the upper and lower operation cylinders 102 as many as the number of the tool and a front and rear operating cylinder 103.

Figure 12A:
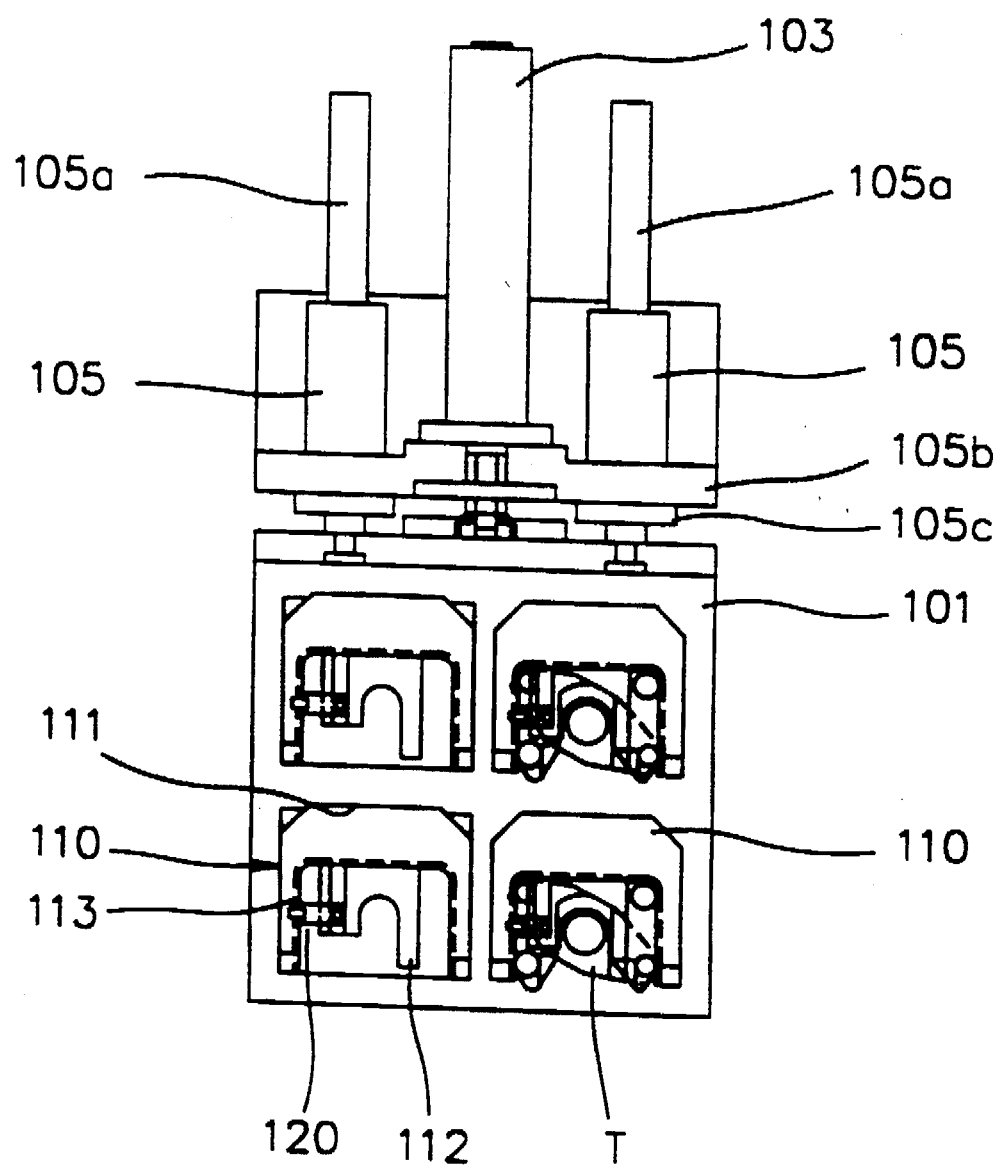
FIG. 12A is a plan view showing a tool automatic changing apparatus for a surface mounting device according to the present invention.

The front and rear supporting plate 101 and the ball bush 105, as shown in FIGS. 12A and 16, includes a fixing plate 105b and a flange 105 connected to each other and a ball bush shaft 105a passed through the inner side thereof.

Figure 12B:
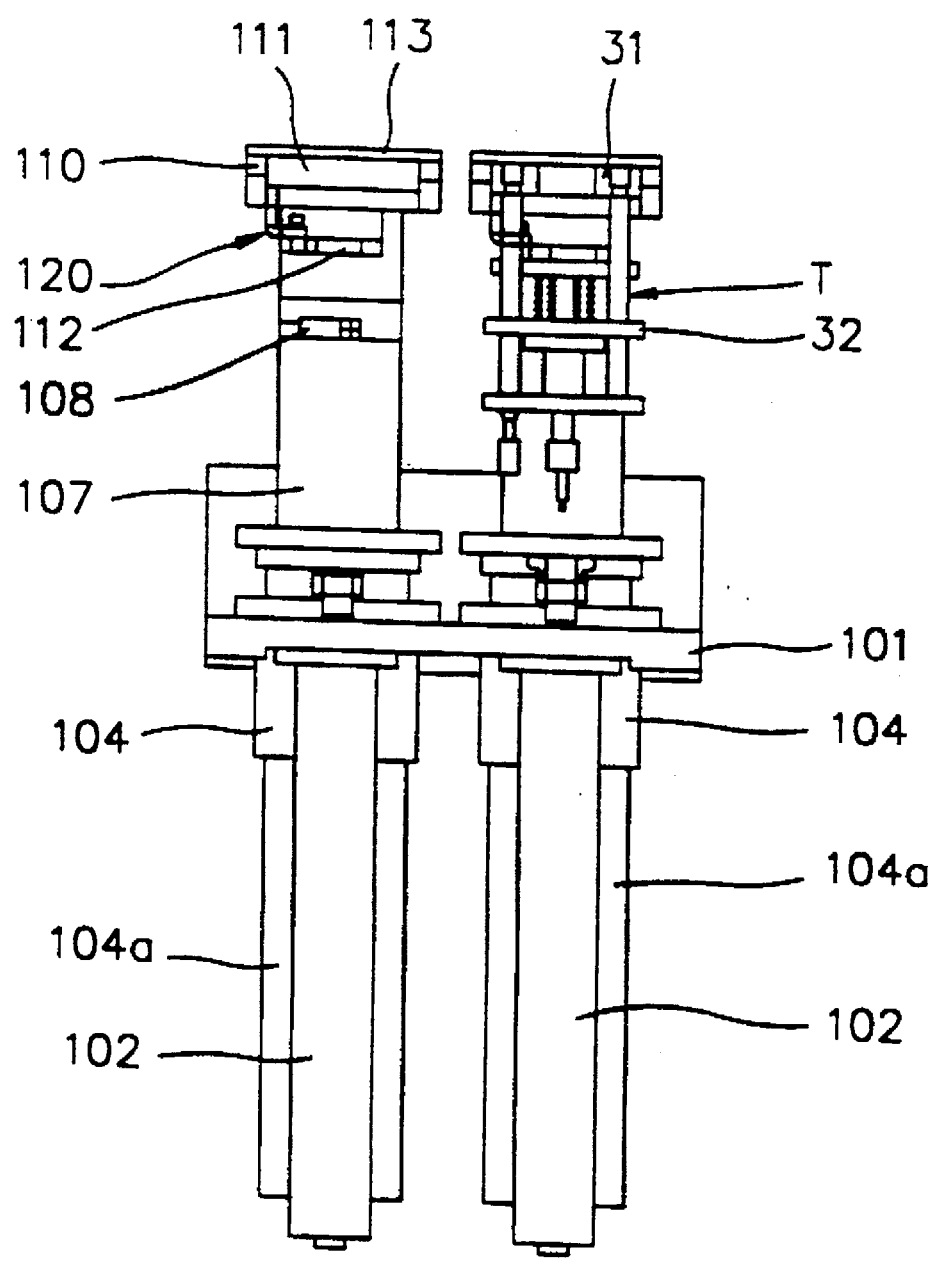
FIG. 12B is a front view showing a tool automatic changing apparatus for a surface mounting deice according to the present invention.
Figure 17:
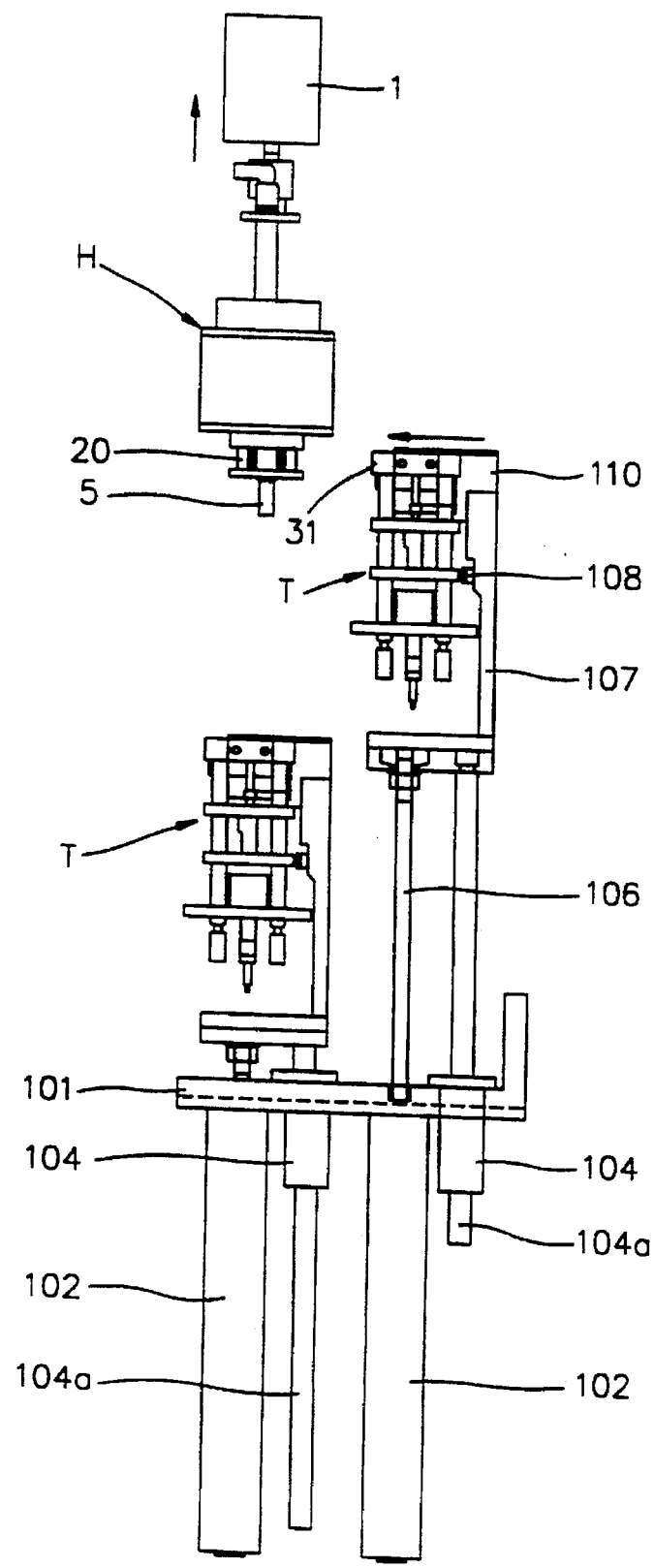
FIG. 17 is a side view showing a tool of a tool automatic changing apparatus for a surface mounting device for explaining an installation of the tool according to the present invention.

Meanwhile, an upper and lower operating cylinders 102 and a ball bush 104, as shown in FIGS. 12B and 16 are disposed at the lower portion of the front and rear supporting plate 101. In addition, the ball bush 104 is inserted in the inner side of the ball bush 104. The upper and lower operating cylinders 102 and the front and rear operating cylinder 103 are guided and supported by the ball bushes 104 and 105. A receiving base 107 having a predetermined length is disposed on the upper portion of the rod 106 of the upper and lower operating cylinder 102 as shown in FIGS. 16 and 17. An adjacent sensor 108 is fixed to a portion corresponding to the intermediate 32 of the tool T engaged to the head block section H, and a receiver 110 is disposed on the upper section of the receiver 107 for supporting the tool T.

Figure 13:
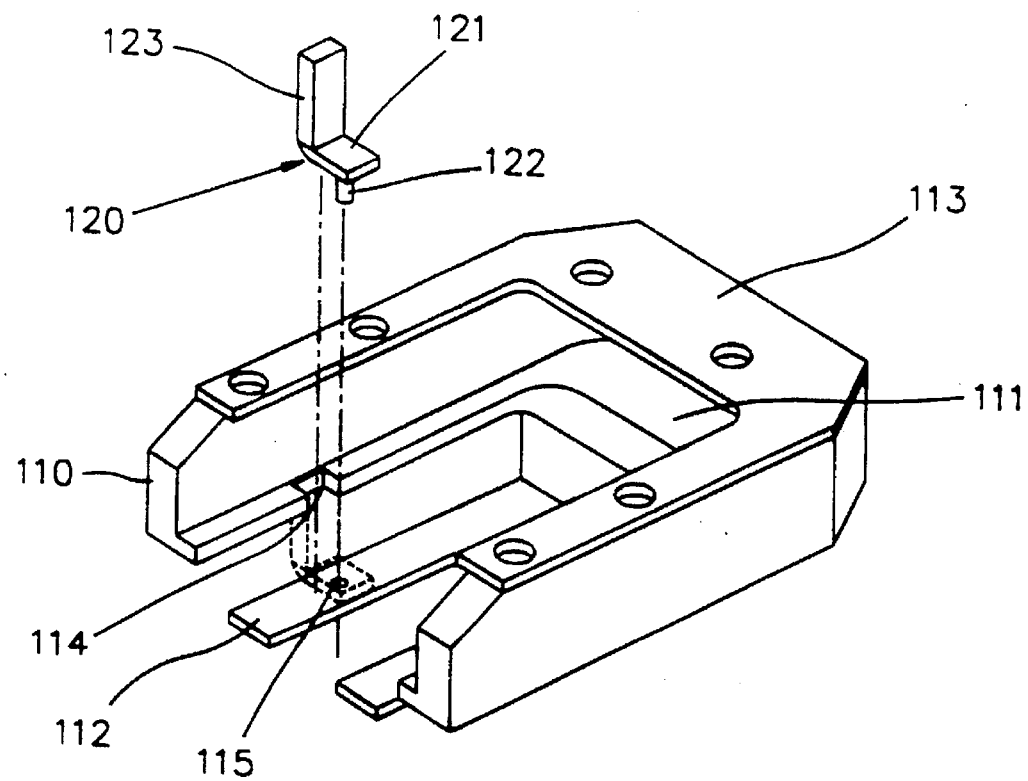
FIG. 13 is a perspective view showing a tool fixing member of a tool automatic changing apparatus for a surface mounting deice according to the present invention.
Figure 15:
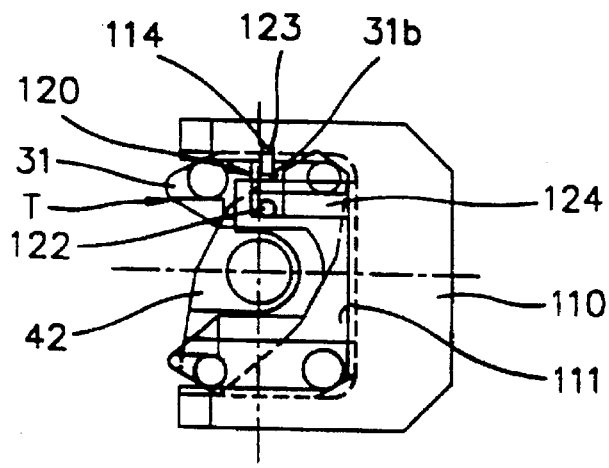
FIG. 15 is a plan view showing a tool engaged to a receiver of a tool automatic changing apparatus for a surface mounting device according to the present invention.

The receiver 110, as shown in FIGS. 13 and 15, includes an engaging groove 111 in which one portion there is opened for engaging to the change plate 31 of the tool T and includes a stationary base 112 disposed at the lower portion thereof and a cover 113 disposed on the upper surface thereof.

An engaging groove 114 is formed in the inner wall of the engaging groove 111 as shown in FIG. 13, and a pin opening 115 is disposed at the one side of the stationary base 112. In addition, the receiver 110 includes a tool fixing member 120 for stably fixing the tool T.

Figure 14A:
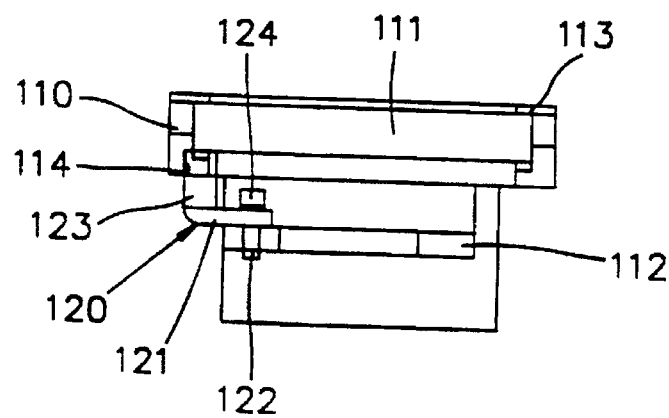
FIG. 14A is a front view showing a receiver, in which a tool is not engaged, of a tool automatic changing apparatus for a surface mounting apparatus according to the present invention.
Figure 14B:
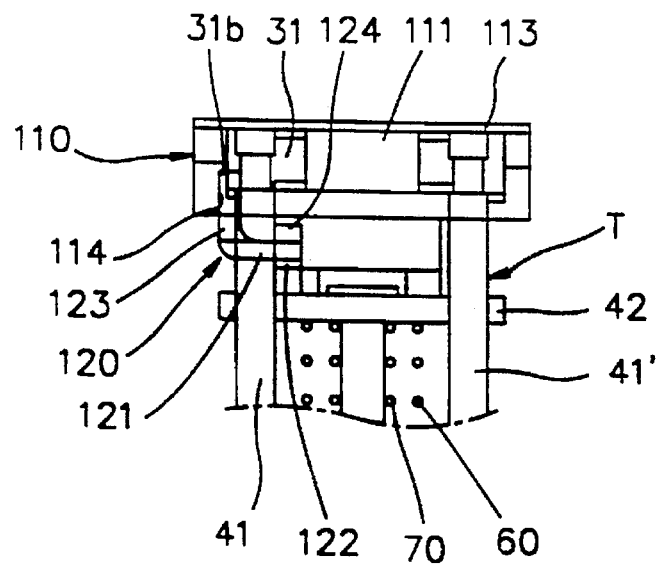
FIG. 14B is a front view showing a receiver, in which a tool is engaged, of a tool automatic changing apparatus for a surface mounting device according to the present invention.

The tool fixing member 120, as shown in FIGS. 13 and 14A and 14B, includes a horizontal lever 121 having a predetermined length, a pushing pin 122 fixed to one end of the lower surface of the horizontal lever 121 and inserted to the pin opening 115 of the stationary 112, an engaging pin 123 fixed to the other end of the upper surface of the horizontal lever 121 and inserted into the engaging grooves 31b and 114 of the receiver 110 and the change plate 31, and a plate spring 124 fixed to the rear portion of the receiver 110 for elastically supporting the horizontal lever 121.

The operation of the tool for a surface mounting device and the tool automatic changing apparatus will now be explained.

When the driving motor 21 is driven, the driving force is transmitted to the driving timing pulley 23 disposed at the rotary shaft 22, the timing belt 24 and the timing belt 19.

Thereafter, the driving force drives the ball splines 12 and 13 and the ball spline shaft 5 through the angular ball bearings 9 and 10 disposed in the rectangular block 8.

The driving force transmitted to the timing pulley 19 is not transmitted to the cylinder connection plate 4 due to the ball bearing 8 supporting the ball spline 5 and is also not transmitted to the pneumatic tube due to the tray type pneumatic connection port 7.

Meanwhile, the change base 20 rotates by the rotation force of the ball spline. At this time, the change plate 31 of the tool T as shown in FIGS. 3 and 4, are drivingly engaged with the two flat sections 20c and the circular section 20f in the engaging groove 20a of the change base 20 and the shaft section 20b. In addition, the engaging ball 35 of the change plate 31 is elastically supported by the pressurizing spring 36 to the engaging groove 20c formed on the both sides of the shaft section 20b and tightly pushes the change base 31, so that the rotation force of the ball spline shaft 5 is transmitted to the change plate 31 without backlash and rotates the change plate 31.

The change plate 31, the intermediate plate 32 disposed below the change plate 31, nd the guiding plate 33 disposed below the intermediate plate 32 are supported by the fixing shafts 34 and 34' and rotates together.

Figure 10A:
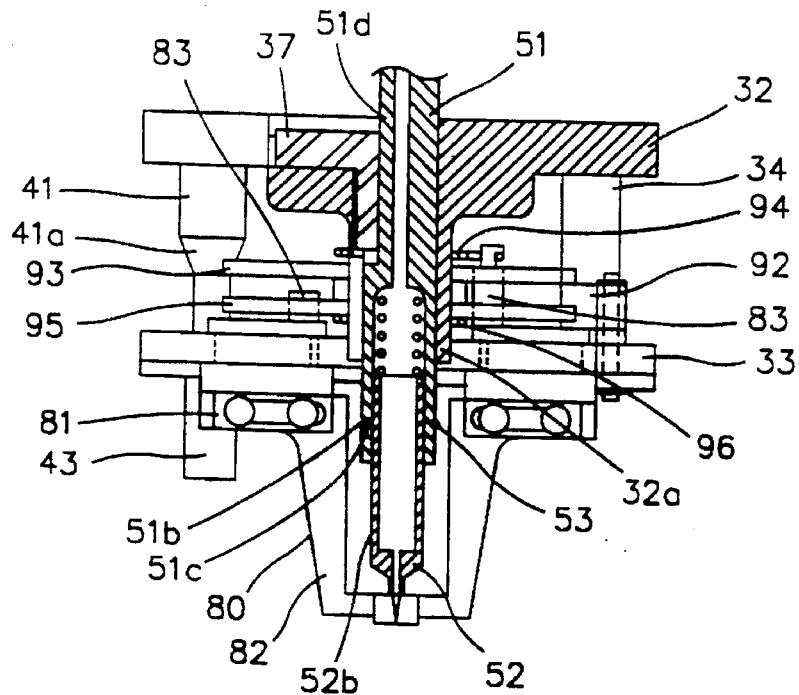
FIG. 10A is a front view showing a jaw when it is closed according to the present invention.
Figure 10B:
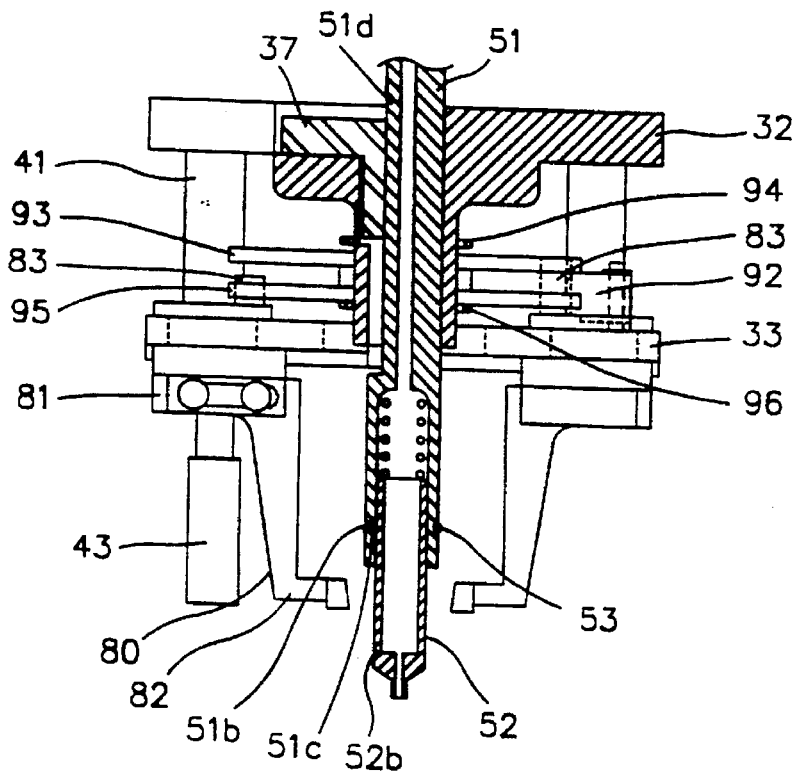
FIG. 10B is a front view showing a jaw when it is opened according to the present invention.

As shown in FIGS. 4 and 10A and 10B, the nozzle shaft 51 and the suction nozzle 52 are guided by the rotary prevention blade 37 and the fixing spring 53 to limit the rotation against the intermediate plate 32 and the nozzle shaft 51, so that the rotation movement of the intermediate plate 32 is directly transmitted to the suction nozzle 52. In addition, the alignment chuck 81 of the parts retaining slider 80 is inserted into the guiding opening 33b formed at 90° angle in the guiding plate 33. A jaw 82 is fixed to the alignment chuck 81, so that the parts retaining slider 80 rotates by means of the rotation of the guiding plate 33.

The rotation force transmitted from the driving motor 21 rotates the suction nozzle 52 and the jaw 82 about the angular ball bearings 9 and 10 and determines a proper surface mounting rotation angle of the surface mounting device parts.

Meanwhile, the up/down movement of the surface mounting device head is implemented by the force of the pneumatic cylinder 1. That is, as shown in FIG. 2, when the rod 2 is lowered by the driving force of the pneumatic cylinder 1, the lowering force is transmitted to the ball joint 3 and the cylinder connection plate 4 and up to the ball bearing 6 fixed to the ball spline shaft 5. At this time, the ball joint 3 compensates the variation of the pneumatic cylinder 1 and the ball spline shaft 5 and guides the pneumatic cylinder 1 and the ball spline shaft 5.

The force downwardly applied to the ball spline shaft 5 from the pneumatic cylinder 1 lowers the ball spline shaft 5, and the recess 5b of the ball spline shaft 5 lowers the pushing plate 42 by pushing the pushing plate 42 of the tool T. Thereafter, the nozzle shaft 51 lowers as the pushing plate 42 lowers. At this time, the pushing plate 42 and the nozzle shaft 51 are spaced apart by a predetermined distance "d," and the ball spline shaft 5 is lowered as much as the distance "d" and then the nozzle shaft 51 is lowered, so that the suction nozzle 52 is lowered in a state that the jaw 82 is outwardly widened.

The opening operation of the jaw 82 in accordance with the lowering of the pushing plate 42 will now be explained.

The pushing shafts 41 and 41' fixed to the both sides of the pushing plate 42 being lowered beyond the elastic force of the elastic member 60 are vertically lowered along the guide openings 32b and 33a formed on the intermediate plate 32 and the guiding plate 33.

Figure 11A:
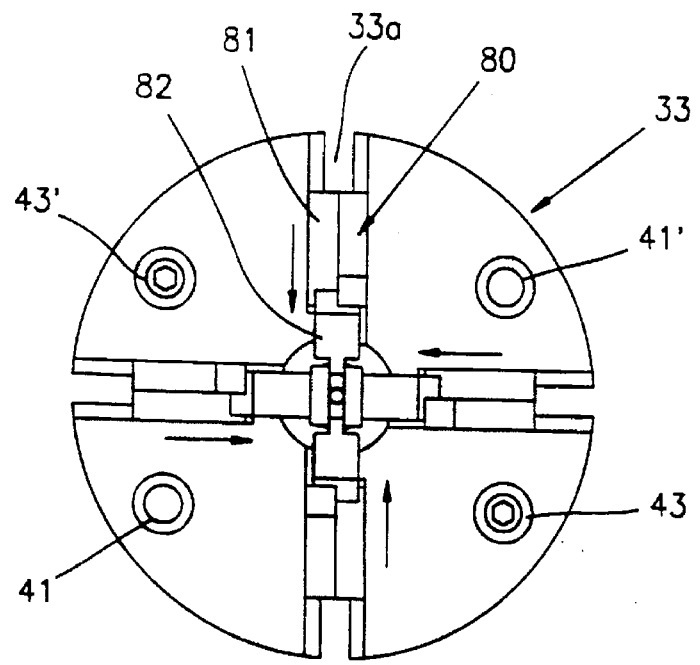
FIG. 11A is a bottom view showing a jaw when it is closed according to the present invention.

At this time, the alignment member 90 becomes activated by the tapered sections 41a and 41a' formed on the lower portion of the pushing shafts 41 and 41'. That is, FIGS. 9A, 10A, and 11A show that the jaw 82 of the alignment member 90 is closed. At this time, the alignment plate 93 and the lower alignment plate 95 have clockwise directional rotation force by the elastic members 94 and 96. Therefore, the operating levers 92 and 92' rotates counterclockwise about axis pins 91 and 91'. In addition, the cam pin 83 of the alignment chuck 81 is inserted in the cam openings 93a and 95a of the lower alignment plate 95.

In the above-described state, when the tapered sections 41a and 41a' push by the lowering of the pushing shafts 41 and 41', the operating levers 92 and 92' rotate clockwise about the axis pins 91 and 91' and push the engaging pins 97 and 98 fixed to the upper alignment plate 93 and the lower alignment plate 95 by the rotation movement, so that the upper alignment plate 93 and the lower alignment plate 95 rotates counterclockwise.

Figure 11B:
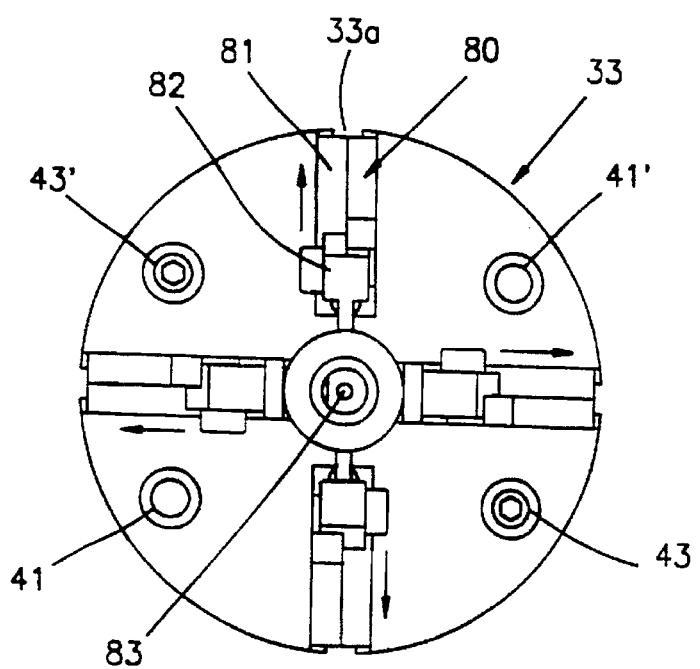
FIG. 11B is a bottom view showing a jaw when it is opened according to the present invention.

Therefore, the cam pin 83 of the alignment chuck 81 inserted into the cam openings 93a and 95a of the upper alignment plate 93 and the lower alignment plate 95 is pushed outwardly by the cam openings 93a and 95a. At this time, when the parts retaining slider 80 moves along the guiding opening 33b of the guiding plate 33, the cam pin 83 comes into contact with the outer end. In addition, the alignment chuck 81 including the jaw 82, as shown in FIGS. 9B, 10B, and 11B, keeps outwardly widened state.

When the tapered sections 41a and 41a' of the pushing shafts 41 and 41' pass over the operating levers 92 and 92', the rotation of the operating levers 92 and 92' stops, and the movement of the alignment chuck 81 stops. At this time, the lower portion of the pushing plate 42 lowers the nozzle shaft 51 by pushing the nozzle shaft 51.

Meanwhile, when the rod 2 is lifted by the driving force of the pneumatic cylinder 1, the ball joint 3, the cylinder connection tube 4, and the ball spline shaft 5 are lifted. At this time, the lifting operation of the ball spline shaft 5 releases the pushing force of the pushing plate 42. The pushing plate 42 is lifted by the recovering force of the elastic member 60 engaged between the pushing plate 42 and the intermediate plate 32.

As described above, when the pushing plate 42 is lifted, the nozzle shaft 51 pushing the pushing plate 42 is lifted together with the pushing plate 42 by means of the recovering force of the elastic member 70. The lifting force of the pushing plate 42 is transmitted to the pushing plates 41 and 41', and the nozzle shaft 51 stops lifting before the tapered sections 41a and 41a' of the pushing shafts 41 and 41'.

Thereafter, when the tapered sections 41a and 41a' comes into contact with the operating levers 92 and 92' by the lifting operation of the pushing shafts 41 and 41', the upper alignment plate 93 and the lower alignment plate 95 rotate counterclockwise by the recovering force of the elastic members 94 and 94', so that the cam pin 83 located at the outer end of the cam openings 93a and 95a moves to the inner side along the shape of the cam openings 93a and 95a. Therefore, the alignment chuck 81 is guided by the guiding opening 33b of the guiding plate 33 and moves toward the suction nozzle 52.

Meanwhile, the operation of the separation and engagement of the head clock section H and the tool T according to the tool automatic changing apparatus according to the present invention will now be explained.

To begin with, so as to separate the tool T, the pushing plate 42 and the pushing shafts 41 and 41', as shown on FIG. 2, are lowered by the driving force of the pneumatic cylinder 1.

When the rod 2 of the pneumatic cylinder 1 is lifted in a state that the pushing plate 42 is pushed downwardly, the ball spline shaft 5 is took out from the nozzle shaft 51 and the pushing plate 42. At this time, the change base 20, as shown in FIG. 6, is pushed toward an arrow indicated in FIG. 6, the change plate 31 of the tool T is took out from the change base 20, so that the tool T is separated from the head block section H.

In order to mount the tool T on the change base 20 of the head block section H again, the pushing plate 42 and the nozzle shaft 51 should be lowered by pushing the pushing plate 42, and the change plate 31 of the tool T should be pushed to the change base 20 of the head block section H. When removing the outside force applied to the pushing plate 42, the tool T is engaged to the head block section H as the pushing plate 42 and the nozzle shaft 51 are lifted by the elastic recovering force of the elastic members 60 and 70.

The operation of the separation and engagement of the tool T according to the tool automatic changing apparatus according to the present invention will now be explained in more detail.

To begin with, the separation of the tool T will now be first explained. The surface mounting device head in which the tool T is engaged is stopped at the upper front portion of the receiver 110i which the tool T is not provided therein.

Thereafter, when the rod 106 is lifted by the upper and lower operating cylinder 102, the receiver base 107 having the receiver 110, as shown in FIG. 16, is lifted and stops at a location, the height of which corresponds to that of the change plate 31 of the tool T. At this time, as shown in FIG. 14A, the tool fixing member 120 disposed in the receiver 110 is downwradly pushed by the plate spring 124, and the pushing pin 122 of the tool fixing member 120 is projected downwardly through the pin opening 115 of the stationary base 112.

In the above-described state, the rod 2 is lowered by the pneumatic cylinder 1 of the head block section H, the ball spline shaft 5 is lowered in the same operation described above. Thereafter, the pushing plate 42 and the pushing shafts 41 and 41' are lowered.

Thereafter, when the front and rear support plate 101 moves to the left as the front and rear operation cylinder 103 forwardly moves, the upper and lower operation cylinder 102, the receiver base 107 and the receiver 110 which are supported by the front and rear support plate 101 move forwardly together. The forwarding movement of the front and rear support plate 101, as shown in FIG. 15, stops after the change plate 31 of the tool T is engaged to the engaging groove 111 of the receiver 110. At this time, the pushing plate 42 being pushed by the head block section H moves under the stationary base 112 disposed below the receiver 110.

Thereafter, the ball spline shaft 5 is lifted by the pneumatic cylinder 1 of the head block section H, and the pushing plate 42 is lifted by the recovering force of the elastic member 60 disposed between the pushing plate 42 and the intermediate plate 32, and the pushing plate 42, as shown in FIG. 14B, is beyond the elastic force of the plate spring 124, so that the pushing pin 122 of the tool fixing member 120 is lifted and stops by the stationary base 112.

Thereafter, the ball spline shaft 5 is lifted in a state that the pushing plate 42 is stopped by the stationary base 112 and is separated from the nozzle shaft 51, and is separated upwardly. At the same time, the engaging pin 123 of the tool fixing member 120 lifted by the pushing plate 42 is inserted in the receiver 110 and the engaging grooves 31b and 114 of the change plate 31, so that the tool T is engaged to the receiver 110.

Thereafter, the front and rear support plate 101 moves backwardly by the front and rear operation cylinder 103, the change base 20 and the change plate 31 retained by the engaging ball 35 are separated from each other, and the tool T moves toward the receiver 110. At this time, the adjacent sensor 108 senses whether the toll T is separated therefrom, and the receiver 110 having the tool T is lowered by the upper and lower operation cylinder 102 to the original position.

Meanwhile, when mounting the tool T of the receiver 110 to the head block section H, the head block section H not having the tool T moves and stops at the upper front portion of the receiver 110 having the tool T by the movement of the X-Y table.

Thereafter, as shown in FIG. 17, the receiver 110 is lifted up to the height of the change base 20 of the head block section H by the upper and lower operation cylinder 102. In the above-described state, the front and rear support plate 101 moves forwardly by the front and rear operation cylinder 103, and the change base 31 of the tool T is engaged to the change base 20 of the head block section H.

In a state that the engagement of the tool t is completed, when the ball spline shaft 5 is lowered by the pneumatic cylinder 1 of the head block section H, and the pushing plate 42 is lowered by the previously described operation, the ball spline shaft 5 in inserted into the nozzle shaft 51, and the pushing plate 42 and the nozzle shaft 51 are lowered together.

When the pushing plate 42 is separated from the stationary base 112 of the receiver 110, the engaging pin 123 is separated from the receiver 110 and the engaging grooves 31b and 114 of the change plate 31 by the recovering force of the plate spring 124, so that the locking state of the tool T is released. Thereafter, the head block section H limits the nozzle shaft 51 by the ball spline shaft 5 and controls the separation of the nozzle shaft 51 from the change base 20 of the tool T.

Thereafter, when the front and rear operation cylinder 103 moves backwardly, the tool T is separated from the receiver 110 and is engaged to the change base 20 of the head block section H. At this time, the adjacent sensor 108 cheeks whether the engagement of the tool T. When the tool T is normally engaged, the upper and lower operation cylinder 102 is lowered, and the receiver 110 returns to the original position.

As described above, the tool for a surface mounting device includes a parts alignment chuck apparatus which horizontally runs while receiving a guide of a guiding plate, and an upper alignment plate and a lower alignment plate capable of enabling opposed alignment chucks, so that more stable can be achieved in a horizontal direction. Above-mentioned horizontal alignment chucks are not interfered from the shape of the corresponding parts, so that many kinds of parts can be used. In addition, when the operation force is transmitted to the alignment chucks, the idle operation speed can be achieved.

Even though the alignment of a surface mounting is well completed, the variation of the suction nozzle can interfere the surface mounting accuracy because the jaw becomes widened and the suction nozzle retains the corresponding parts; however, the suction nozzle of the tool according to the present invention prevents the rotation of the suction nozzle because the suction nozzle has a flat surface section and the fixing spring disposed in the nozzle shaft tightly contacts with the above-mentioned flat surface section. In addition, the angle type parts surface mounting device head should be changed in accordance with its kinds of the surface mounting parts. In some case, the suction nozzle should be changed.

Meanwhile, the tool change is performed by inserting the ball spline shaft disposed in the rectangular block to the nozzle shaft and fixing the tool to the center portion of the rectangular block because it has the change base rotatably disposed to the rectangular block of the head block section. The tool is fixed by the change base and the change plate and receives the rotation force. The tool receives an up/down lineal movement force of the cylinder by the ball spline shaft and the nozzle shaft disposed in the central portion thereof and fixes the tool to the center of the rectangular block. Therefore, suction nozzle and tool can be changed automatically in operation.

Moreover, the automatic tool changing apparatus is guided by the lineal movement guide and includes a plurality of receivers for up/down and back/forth movement, so that the tool can be separated from the head.

What is claimed is:

1. A tool for a surface mounting device head, comprising:
   a tool body fixed to a plurality of fixing shafts in which a change plate, an intermediate plate, and a guiding plate are fixed in order and spaced apart from a head block section, so that said tool body is detachably engaged to said head block section and a tool automatic changing apparatus;
   pressurizing means engaged to said intermediate plate and said guiding plate of the tool body, being incorporated with a pneumatic cylinder of the head block section and being movable upwardly/downwardly;
   a nozzle section engaged to the central portion of the intermediate plate and the guiding plate, being incorporated with said pressurizing means and being movable upwardly/downwardly;
   first elastic means engaged between said nozzle section and the intermediate plate for upwardly supporting the pressurizing means;
   second elastic means engaged to the outer circumference of the nozzle section for upwardly supporting the nozzle section;

a plurality of parts retaining slider engaged for a lineal movement within a guide opening formed at 90° angle at the guiding plate; and alignment means for enabling said parts retaining slider by the pressurizing means.

2. The tool of claim 1, wherein said change plate includes an engaging groove in which one side thereof, where is engaged to a change base, is opened, and said engaging groove includes a flat section opposed to a shaft section of the change base and a circular portion opposed to said opened portion.

3. The tool of claim 1, wherein an engaging ball engaged to the engaging groove of the change base and disposed at the both sides of said engaging groove is elastically supported by a pressurizing spring.

4. The tool of claim 1, wherein said pressurizing means includes pressurizing shafts engaged to guide openings formed at the both sides of the intermediate plate and the guiding plate, and a pressurizing plate fixed to the upper portion of said pressurizing shaft and coming contact with a recess formed at the lower portion of a ball spline shaft.

5. The tool of claim 1, wherein said pressurizing shafts and fixing shafts each are a pair, and the change plate, the intermediate plate, the intermediate plate, and the guiding plate are corssingly disposed to one another.

6. The tool of claim 1, wherein said nozzle section includes a nozzle shaft engaged to the intermediate plate and the guiding plate, a suction nozzle detachably engaged to the lower portion of said nozzle shaft, a fixing spring engaged to the lower portion of the nozzle shaft for preventing a separation of said suction nozzle, and a pressurizing spring inserted in the nozzle shaft for elastically supporting a suction nozzle.

7. The tool of claim 1, wherein said intermediate plate includes a rotation prevention blade disposed at one side thereof, and in which the inner flat surface thereof comes into contact with a flat surface section longitudinally formed at the outer peripheral of the nozzle shaft passing through the center portion of the intermediate plate.

8. The tool of claim 6, wherein said fixing spring includes a circular section engaged to a spring engaging groove of the nozzle shaft, and a lineal section passing through an opening formed connecting said spring engaging groove of the nozzle shaft, wherein an engaging jaw formed at a flat section of the suction nozzle is engaged to the lineal section.

9. The tool of claim 1, wherein said alignment means includes operating levers rotatably engaged with shaft pins and disposed at the both sides of a guiding plate and coming into contact with tapered sections of pushing shafts, an upper alignment plate rotatably engaged with an intermediate plate and connected to two sliders for enabling said sliders, an elastic member for elastically supporting said upper alignment plate, a lower alignment plate rotatably engaged to the lower portion of the upper alignment plate and connected to the remaining two sliders for enabling the sliders by the operating levers, and an elastic member for elastically supporting the upper alignment plate.

10. The tool of claim 9, wherein said upper alignment plate and lower alignment plate includes cam openings and pin fixing openings which are spaced apart by 90° angle, wherein engaging pins coming into contact with the operating levers are fixed to said pin fixing openings, and wherein cam pin fixed at the upper surface of a parts retaining slider is fixed to said cam openings.

11. The tool of claim 9, wherein said elastic members is a torsion coil spring, in which one end thereof is connected to a predetermined portion of the intermediate plate, and the other end thereof is connected to the engaging pins, so that the upper alignment plate and the lower alignment plate are elastically supported in the same direction.

* * * * *